US011534960B2

(12) United States Patent
Tilita et al.

(10) Patent No.: US 11,534,960 B2
(45) Date of Patent: Dec. 27, 2022

(54) METHOD FOR ADDITIVELY MANUFACTURING A COMPONENT AUGMENTED BY ULTRASONIC EXCITATION AND ACTIVE TEMPERATURE CONTROL

(71) Applicant: The Hong Kong University of Science and Technology, Hong Kong (CN)

(72) Inventors: George Alexandru Tilita, Hong Kong (CN); Wenhao Chen, Hong Kong (CN); Chi Fong Kwan, Hong Kong (CN); Matthew Ming Fai Yuen, Hong Kong (CN)

(73) Assignee: THE HONG KONG UNIVERSITY OF SCIENCE AND TECHNOLOGY, Hong Kong (CN)

( * ) Notice: Subject to any disclaimer, the term of this patent is extended or adjusted under 35 U.S.C. 154(b) by 246 days.

(21) Appl. No.: 16/060,652

(22) PCT Filed: Dec. 9, 2016

(86) PCT No.: PCT/CN2016/109179
§ 371 (c)(1),
(2) Date: Jun. 8, 2018

(87) PCT Pub. No.: WO2017/097252
PCT Pub. Date: Jun. 15, 2017

(65) Prior Publication Data
US 2018/0361727 A1    Dec. 20, 2018

Related U.S. Application Data

(60) Provisional application No. 62/386,758, filed on Dec. 11, 2015.

(51) Int. Cl.
*B29C 64/153* (2017.01)
*B33Y 10/00* (2015.01)
(Continued)

(52) U.S. Cl.
CPC ............ *B29C 64/153* (2017.08); *B22F 10/20* (2021.01); *B22F 12/00* (2021.01); *B29C 64/264* (2017.08);
(Continued)

(58) Field of Classification Search
None
See application file for complete search history.

(56) References Cited

U.S. PATENT DOCUMENTS 6,843,957 B2 * 1/2005 Statnikov ................. B23K 9/32
266/80
6,932,876 B1 * 8/2005 Statnikov .............. B06B 1/0253
148/558
(Continued)

FOREIGN PATENT DOCUMENTS

CN           104086184 A    10/2014

OTHER PUBLICATIONS

Cong, Weilong, and Fuda Ning. "A fundamental investigation on ultrasonic vibration-assisted laser engineered net shaping of stainless steel." International Journal of Machine Tools and Manufacture 121 (Apr. 21, 2017): 61-69. (Year: 2017).*
(Continued)

*Primary Examiner* — Benjamin A Schiffman
(74) *Attorney, Agent, or Firm* — Osha Bergman Watanabe & Burton LLP

(57) ABSTRACT

Embodiments disclosed herein represent powder based additive manufacturing processes which provide a microstructure having improved mechanical properties. The methods may include the use of ultrasonic excitation in combination with the active control of a substrate's temperature to provide some level of control over the microstructure and hence the properties.

10 Claims, 5 Drawing Sheets

(51) Int. Cl.
      *B33Y 30/00*      (2015.01)
      *B29C 64/264*     (2017.01)
      *G06F 30/00*      (2020.01)
      *B22F 12/00*      (2021.01)
      *B22F 10/20*      (2021.01)
      *B33Y 70/00*      (2020.01)
      *B22F 10/10*      (2021.01)

(52) U.S. Cl.
      CPC ............... *B33Y 10/00* (2014.12); *B33Y 30/00* (2014.12); *B33Y 70/00* (2014.12); *G06F 30/00* (2020.01); *B22F 10/10* (2021.01); *B22F 2999/00* (2013.01); *Y02P 10/25* (2015.11)

(56) References Cited

U.S. PATENT DOCUMENTS

| | | | | |
|---|---|---|---|---|
| 7,301,123 | B2* | 11/2007 | Statnikov | B23K 9/091 219/130.51 |
| 10,966,292 | B2* | 3/2021 | Matsen | H05B 6/101 |
| 2015/0064047 | A1 | 3/2015 | Hyde et al. | |
| 2015/0321255 | A1 | 11/2015 | Colin et al. | |

OTHER PUBLICATIONS

Kang, Bongchul, et al. "A study on the effect of ultrasonic vibration in nanosecond laser machining." Optics and lasers in engineering 50.12 (Jul. 27, 2012): 1817-1822. (Year: 2012).*

Machine Translation of CN 104086184 (Year: 2020).*

Eskin, G. I., G. S. Makarov, and Yu P. Pimenov. "Effect of ultrasonic processing of molten metal on structure formation and improvement of properties of high-strength Al—Zn—Mg—Cu—Zr alloys." Advanced performance materials 2.1 (1995): 43-50. (Year: 1995 ).*

Cui, Yan, C. L. Xu, and Qingyou Han. "Effect of ultrasonic vibration on unmixed zone formation." Scripta materialia 55.11 (Sep. 15, 2006): 975-978. (Year: 2006).*

Watanabe, Takehiko, et al. "Improvement of mechanical properties of ferritic stainless steel weld metal by ultrasonic vibration." Journal of Materials Processing Technology 210.12 (Jun. 1, 2010): 1646-1651. (Year: 2010).*

Mizota, Hirohisa, Yoshiaki Nagashima, and Takeshi Obana. "Fundamental study of molten pool depth measurement method using an ultrasonic phased array system." Japanese Journal of Applied Physics 54.7S1 (Jun. 4, 2015): 07HC03. (Year: 2015).*

Han, Qingyou. "Ultrasonic processing of materials." Metallurgical and Materials Transactions B 46.4 (Jan. 30, 2015): 1603-1614. (Year: 2015).*

Yuan, Tao, Sindo Kou, and Zhen Luo. "Grain refining by ultrasonic stirring of the weld pool." Acta Materialia 106 (Jan. 21, 2016): 144-154. (Year: 2016).*

"Proximate, adj." OED Online, Oxford University Press, Jun. 2021, www.oed.com/view/Entry/153562. Accessed Aug. 10, 2021. (Year: 2021).*

Wikipedia contributors. "Ultrasonic horn." Wikipedia, The Free Encyclopedia. Wikipedia, The Free Encyclopedia, Jan. 17, 2018. Web . Jan. 3, 2022. (Year: 2022).*

International Search Report issued in PCT/CN2016/109179 dated Feb. 24, 2017 (2 pages).

Written Opinion of the International Searching Authority issued in PCT/CN2016/109179 dated Feb. 24, 2017 (5 pages).

Office Action issued in corresponding Chinese Application No. 201680069058.9, dated Mar. 27, 2020 (19 pages).

* cited by examiner

METHOD FOR ADDITIVELY MANUFACTURING A COMPONENT AUGMENTED BY ULTRASONIC EXCITATION AND ACTIVE TEMPERATURE CONTROL

CROSS-REFERENCE TO RELATED APPLICATIONS

This application, pursuant to 35 U.S.C. § 119(e), claims priority to U.S. Provisional Application Ser. No. 62/386,758, filed Dec. 11, 2015, which is herein incorporated by reference in its entirety.

FIELD OF THE DISCLOSURE

Embodiments disclosed herein relate generally to an additive manufacturing process for producing of a three dimensional component. More specifically, embodiments disclosed herein relate to additive manufacturing processes that modify the resultant microstructure and overall properties of a printed three dimensional component.

BACKGROUND

The additive manufacturing (AM) of materials generally involves building up a 3-dimensional component in a layer-by-layer manner. Additive manufacturing technology utilizes powders as the raw material and may be applied to a broad range of materials, including metals, polymers, ceramics, and combinations thereof. The powder can be distributed either on-demand via a nozzle or in the form of a powder bed. Embodiments which use a powder bed include a number of industrial AM processes such as, but not limited to, Selective Laser Melting (SLM) and Electron Beam Melting (EBM).

For powder based AM processes, each layer that makes up the 3-dimensional component is printed out by using an energy beam to selectively melt the powders at specific locations which may be defined by a 3-dimensional computer-aided design (CAD) file describing the overall geometry of the component. The energy beam in the case of the SLM process is a high power LASER, and a high voltage electron beam in the case of the EBM process. In these powder-bed processes, the powder bed is lowered by the thickness of one layer after the completion of each layer. Subsequently, the volume of material for another layer is added and spread evenly on top of the previously laid powder bed. A 3-dimensional component can be built by successively printing the cross-sections at different heights, as defined by the CAD file.

Both SLM and EBM technology are well documented. There are also many variations and developments based on these powder-bed AM processes. Embodiments of additive manufacturing processes may be done in a controlled atmosphere, typically through the use of an inert gas or a vacuum, which may prevent chemical reaction(s) from occurring as a result of the high temperatures under the energy beam, e.g. oxidation in the case of metals.

Properties of the printed component may be a result of the internal morphology, or microstructure, of the material which in turn is a result of the solidification conditions in these powder based AM processes. In general, powder based AM processes involve localized melting of materials on top of a relative large volume substrate, often metallic. The temperature of the substrate does not increase significantly as a result of the energy beam melting a small portion of powder near the top surface of the substrate. Accordingly, heat flows, in a relatively uniform direction, from the molten powders to the substrate. The rapid cooling and solidification of materials may lead to a high level of residual stress in the component. Moreover, the directionality of heat flow during solidification may lead to anisotropy in properties of the component. As a result, the as-printed components often display poor fracture and fatigue performances, and poor ductility. To optimize the properties, the as-printed components may be subjected to one or more post-processing step(s) including annealing at relatively high temperature in a furnace. The introduction of one or more post-processing step(s) often raise the energy consumption significantly, and in some cases it may not resolve all the concerns with regards to the properties of the printed components.

The application of ultrasonic vibration into the molten powder may alter the solidification conditions of the molten powder and may prevent undesirable microstructures to form. Ultrasonic vibration may also provide a reduction of anisotropy in the mechanical properties, enhanced fracture and fatigue properties, and improvement in overall toughness of the printed product.

SUMMARY OF THE DISCLOSURE

Embodiments disclosed provide an additive manufacturing process including heating a first material layer to produce a first molten volume; providing ultrasonic excitation to the first molten volume; and cooling the first molten volume in a controlled manner to produce a first fused solid layer.

Embodiments disclosed provide an additive manufacturing system including a substrate including a temperature control mechanism; a laser configured to produce a laser beam directed towards the substrate; an ultrasonic transducer to generate an ultrasonic wave; and an ultrasonic horn coupled to the ultrasonic transducer and the substrate, the ultrasonic horn amplifying the generated ultrasonic wave.

Embodiments disclosed provide an additive manufacturing system including a substrate including a temperature control mechanism; and a pulsed laser configured to produce a laser beam directed towards the substrate and also to generate an ultrasonic wave.

Other aspects and advantages will be apparent from the following description and the appended claims.

DETAILED DESCRIPTION

Embodiments disclosed herein relate generally to a process for producing a three dimensional printed component.

More specifically, embodiments disclosed herein relate to additive manufacturing processes that influence the solidification conditions to modify the resultant microstructure and overall properties of the three dimensional printed components. The processes herein may provide an effective and economical method to minimize or eliminate post-processing annealing.

Within the scope of this application, the expression an "additive manufacturing system" denotes an apparatus in which an energy or matter beam selectively melts a powder at specific locations as may be defined by a 3-dimensional computer-aided design (CAD) file describing the overall geometry of the component. In some embodiments, the energy beam is a high power LASER (sometimes referred to as an SLM process), or a high voltage electron beam (sometimes referred to as an EBM process). A 3-dimensional component can be built by successively printing the cross-sections at different heights, as defined by the CAD file.

Embodiments disclosed herein also apply ultrasonic vibration into a molten powder. The ultrasonic vibration may alter the solidification conditions of the molten powder and thereby prevent undesirable microstructure from forming.

Figure 1:
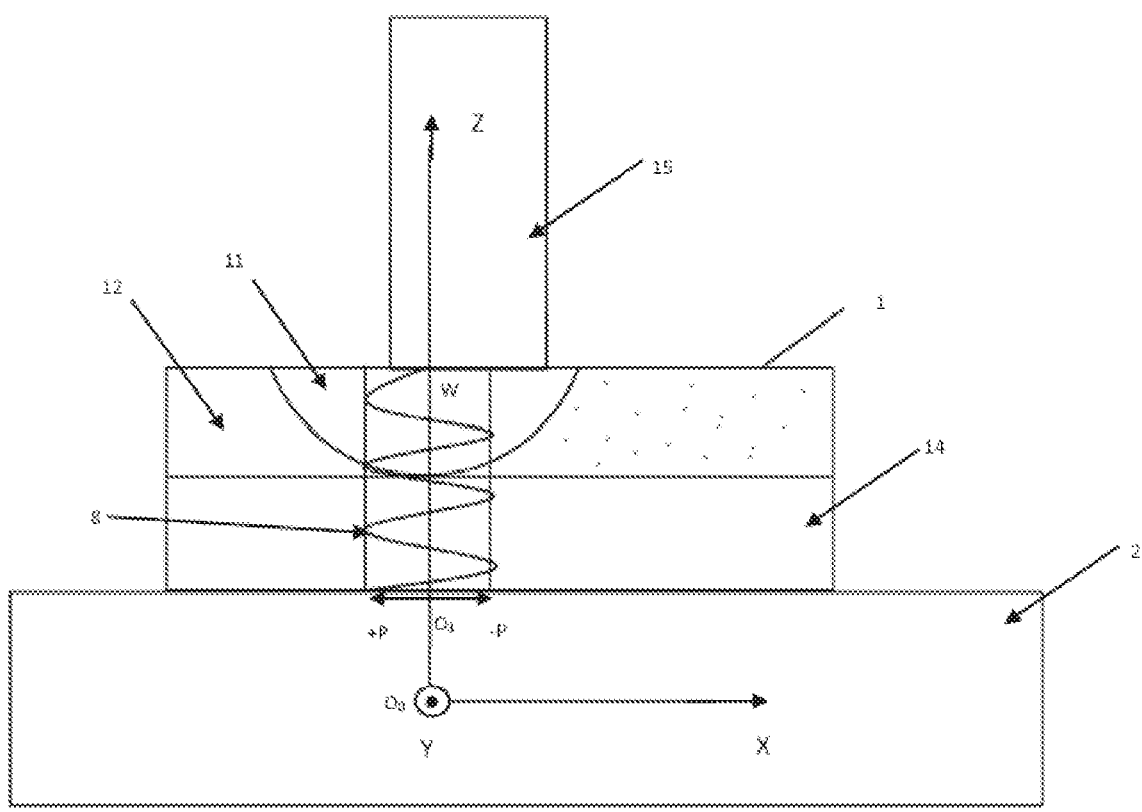
FIG. 1 is a system for the additive manufacturing of printed components according to embodiments disclosed herein.

FIG. 1 illustrates an embodiment of an apparatus for an AM process without controlled heating and/or cooling. In general, the AM process includes thermally subjecting a powder (1) by an energy beam (15). In some embodiments, the powder (1) may include metals, polymers, ceramics and combinations thereof. Selection of the powder and it's corresponding properties may influence the properties of the layers formed. One of ordinary skill in the art will be capable of selecting the powder and its properties to provide the desired properties of the manufactured component. In some embodiments, the energy beam (15) may include a LASER beam, a voltage beam, a particle beam, and forms of electromagnetic radiation. A volume (11) of powder under and around the energy beam will reach a melting temperature and form a fused solid (12) upon cooling and solidification after the energy beam is moved to another location along a desired path. In some embodiments, a temperature gradient will be formed from about the center of the energy beam (i.e., where the energy beam hits the material and where the energy beam exists at the highest temperature) to outside the path of the energy beam. The degree of melting of the material depends on a number of factors, including but not limited to, the power of the energy beam and the scanning speed of the energy beam. In some embodiments, the energy beam may overlap a previous path during the scanning such that if melting occurs outside the region, the material may be melted again.

The melting temperature of the powder is dependent on its composition, but the range of melting temperatures may range from about 373 degrees Kelvin to about 3773 Kelvin degrees for a metallic alloy and from about 373 degrees Kelvin to about 5280 Kelvin degrees for a ceramic, both at atmospheric pressure. In some embodiments, the fused solid may form a layer atop a previous layer (14), or layers. Layers may be formed by repetitively laying powder on top of a previous layer (14), melting the powder (1) and cooling/solidification of the powder into a fused solid (12). In some embodiments, an ultrasonic wave (8) may be sent through a substrate (2) or from any direction into the fused solid (12), the powder (1), and the molten volume (11). In some embodiments, the substrate (2) may be made of, but not limited to, a metal, a metallic alloy, a ceramic alloy, any combination thereof as known to one of ordinary skill in the art. The propagation direction "W" of the ultrasonic wave may be at any angle from the 'Z' axis. The angle may range from about 0 degrees to about 359 degrees. The waveform may be described as an increase in Acoustic Pressure (P+) and decreased Acoustic Pressure (P−) with O1 being the atmospheric pressure in the surrounding areas. The waveform may be described as a sine wave along the entirety of the apparatus from an ultrasonic wave producer to the air boundary, where the pressure at each point along the axis of the waveform is dictated by the pressure value on the waveform. The pressure may be several orders of magnitude higher in certain points along the axis which may experience ultrasonic cavitation. The pressure value depends on the amplitude of the wave, the speed of sound through the medium (be it metal or anything else) and the frequency of vibration. In some embodiments, the pressure value may be the total hydrostatic pressure. The pressure value may contain the acoustic pressure determined by the wave, the static pressure (such as atmospheric pressure), and the pressure generated by cavitational shockwaves.

Embodiments disclosed herein also apply active control over the substrate's temperature may also be included to enhance the overall cooling, and hence the solidification, rate of the molten powder. The active control of cooling rate may optimize the efficacy of the ultrasonic vibration, and provide further influence on the resulting microstructure of the printed product.

Figure 2:
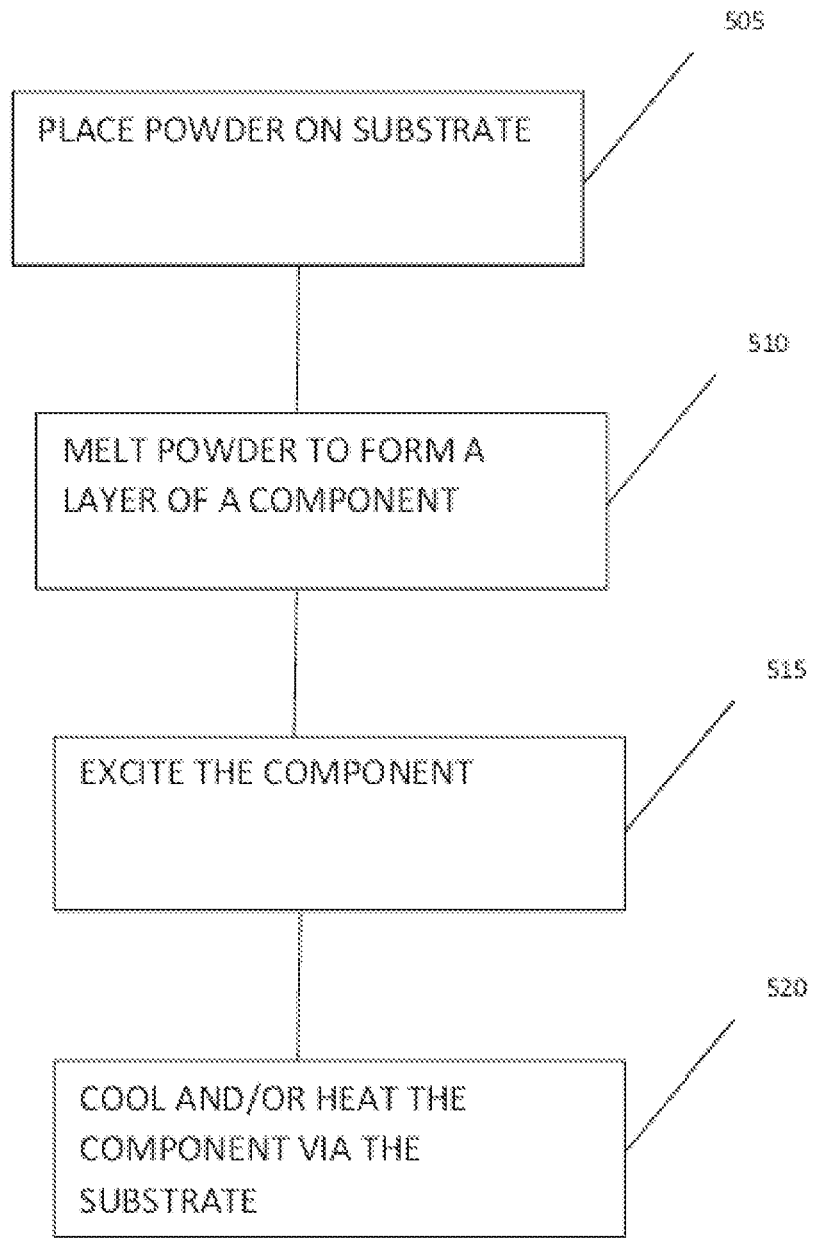
FIG. 2 is a method for producing a printed component using an additive manufacturing system according to embodiments disclosed herein.

FIG. 2 illustrates an embodiment of an AM process (500) which may alter the internal morphology, or microstructure, of the fused solid material as a result of actively controlling the cooling conditions via a substrate, which may alter the solidification conditions of the AM process. In some embodiments, the active control may be provided through the use of a coolant, a heating source, an ultrasonic wave, and combinations thereof. One of ordinary skill in the art may determine the active control may based on time temperature transformation diagrams which describe achievable microstructures based on cooling of a particular material. The method of FIG. 2 may be used with any embodiments of the apparatuses of FIGS. 3-5 and the description provided below. Powders may be placed onto a substrate in step 505. In some embodiments, the powder may include metals, polymers, ceramics and combinations thereof. Selection of the powder and it's corresponding properties may influence the properties of the layers formed. One of ordinary skill in the art will be capable of selecting the powder and its properties to provide the desired properties of the manufactured component.

In some embodiments, the temperature of the substrate may be increased to a temperature close to that of the melting temperature of the selected powder material. The temperature increase may reduce the thermal shock between the powder and the substrate and may alter the speed with which the thermal energy of the melted powder is absorbed into the substrate. The temperature of the substrate may be increased to provide a homogeneous temperature to the component being formed through the AM process (500). The substrate may be heated before, during or after the AM process (500) as determined by one of ordinary skill in the art.

The powder may be melted in step (510). In some embodiments, the melting occurs by an energy beam being delivered to the powder and a volume of powder under and around the energy beam reaching a melting temperature, melting, and creating a liquid powderform. In some embodiments, the energy beam may include a LASER beam, a voltage beam, a particle beam, and forms of electromagnetic radiation. The melting temperature of the powder is dependent on its composition, but the range of melting temperatures may range from about 373 degrees Kelvin to about 3773 Kelvin degrees for a metallic alloy and from about 373 degrees Kelvin to about 5280 Kelvin degrees for a ceramic, both at atmospheric pressure. In some embodiments, after melting a volume of powder, the energy beam will be moved to another location. In some embodiments, the substrate may be heated to provide a controlled temperature to the powder and/or liquid powderform during the melting of the powder. Heating the substrate may also reduce the cooling rate of the melted powder which may reduce residual thermal stresses which may require energy intensive post-processing. In some embodiments, the temperature of the substrate may be a percentage of the melting temperature of the powder material. In some embodiments, the percentage of the melting temperature may range may be from about 1% to about 99%, and points there between. The substrate may be heated by a heating source such as an induction coil, electro-resistive coils or elements, electromagnetic radiation heating or other heating sources which will control a temperature of the substrate.

Ultrasonic waves may be propagated through the liquid powderform to excite the liquid powderform in step (515). In some embodiments, the ultrasonic waves may be propagated throughout the AM process (500). The ultrasonic waves are sine waves which may vary in frequency from about 20 kHz to about 20 MHz. The ultrasonic waves may hit the melt pool of powder at any angle ranging from about 0 to about 360 degrees around the melt pool. In some embodiments, the ultrasonic waves may be provided by an ultrasonic transducer or a pulsed laser. In some embodiments, an ultrasonic horn may be used to amplify the ultrasonic waves. In some embodiments, the amplitude of the ultrasonic waves may be increased by gradually reducing the width of the ultrasonic horn. The propagation direction of the ultrasonic wave may be at any angle from the Z axis. The angle may range from about 0 degrees to about 360 degrees. The waveform may be described as an increase in Acoustic Pressure (P+) and decreased Acoustic Pressure (P−) with O1 being the atmospheric pressure in the surrounding areas. The waveform may be described as a sine wave along the entirety of the apparatus from an ultrasonic wave producer to the air boundary, where the pressure at each point along the axis of the waveform is dictated by the value on the waveform. In some embodiments, the pressure value may be the total hydrostatic pressure. The pressure value may contain the acoustic pressure determined by the wave, the static pressure (such as atmospheric pressure), and the pressure generated by cavitational shockwaves. The pressure may be several orders of magnitude higher in certain points along the axis which may experience ultrasonic cavitation. In some embodiments, the ultrasonic waves may be propagated through the substrate as the powder is being melted in step 510. In other embodiments, the ultrasonic waves may be propagated through the substrate before, during and after the powder is melted or any combination as the powder is melting.

In embodiments utilizing a pulsed laser to produce the ultrasonic waves, the ultrasonic waves may be produced by the pulsed laser, alone or in combination with an ultrasonic transducer and/or an ultrasonic concentrator (or horn). In embodiments which utilize a pulsed laser, the laser (15) as shown in FIG. 1, will oscillate between an active state and a non-active state at frequencies raging from about 20 kHz to about 20 MHz. During the active state, the powder (material) upon which the laser beam is projected will expand due to the thermal expansion properties. While the beam is non-active, the powder (material) no longer under a heat flux, will have its temperature reduced and thermally contract. The oscillation between the material expansion and contraction, done at ultrasonic frequencies, generates localized vibrations which may have an effect on the solidifying material in proximity to the laser (15).

In some embodiments, the liquid powderform is controllably cooled and solidified to form a fused solid in step (520). In some embodiments, the target cooling rate may be determined based on the desired mechanical properties which may be determined by the microstructure formed. One of ordinary skill in the art may use time temperature transformation diagrams which describe achievable microstructures based on cooling of a particular material to determine a desired target cooling rate. Some examples include, but are not limited to, increasing the cooling rate to provide a component with high strength and low ductility, or reducing the cooling to provide a component with better ductility and lower strength. In some embodiments, the cooling rate may range from about 6,000,000 degrees per second to about 10 degrees per minute.

The cooling rate may be constant or may vary with respect to time as to allow for different desired mechanical properties due to the desired ratio of different kinds of grains formed in the component. Different kinds of grains, which have different mechanical properties, may form at different cooling rates. Thus, by controlling the cooling rate to be constant or to vary over time, a desired microstructure may be provided. In some embodiments, the cooling rate may be chosen due to the composition of the powder, the desired final properties of the three dimensional component, the material of the composition, the coolant, etc.

In some embodiments, the controlled cooling may occur via a coolant flowing through the substrate. In some embodiments, the coolant may be a liquid, a gas, a cryogenic liquid, a noble gas, water or combinations thereof. In some embodiments, the exciting occurs during the controlled cooling. In other embodiments, the heating and cooling of the substrate may occur simultaeneously to adjust the temperature of the substrate. In still other embodiments, the exciting may occur throughout the process or while certain sections of the components are printed to reduce grain size the particular regions. The active control over the substrate temperature may provide a manner of controlling the overall cooling rate, and hence the solidification, of the molten powder into the fused solid. The active control of cooling rate may be used to optimize the efficacy of the ultrasonic vibration and to provide further influence on the resulting microstructure of the printed product. The combination of the heating/exciting/cooling may allow a graded microstructure with graded mechanical properties, i.e., different mechanical properties at different regions of the component.

In some embodiments, the steps (505)/(510)/(515)/(520) may be repeated, such that a second layer of powder is placed on the fused solid, the second layer is heated to produce a second molten volume, the second molten volume has ultrasonic waves propagated therethrough and actively controlling the cooling of the second molten volume to form another fused solid layer of the three dimensional component. In still further embodiments, the process of steps (505)/(510)/(515)/(520) may be repeated until a desired three dimensional component is completed. In other embodiments, the completed three dimensional component may go through one or more post-processes, such as annealing, aging, tempering, quenching, selective heat treating, cold and cryogenic treating, decarburization, or combinations thereof.

Figure 3:
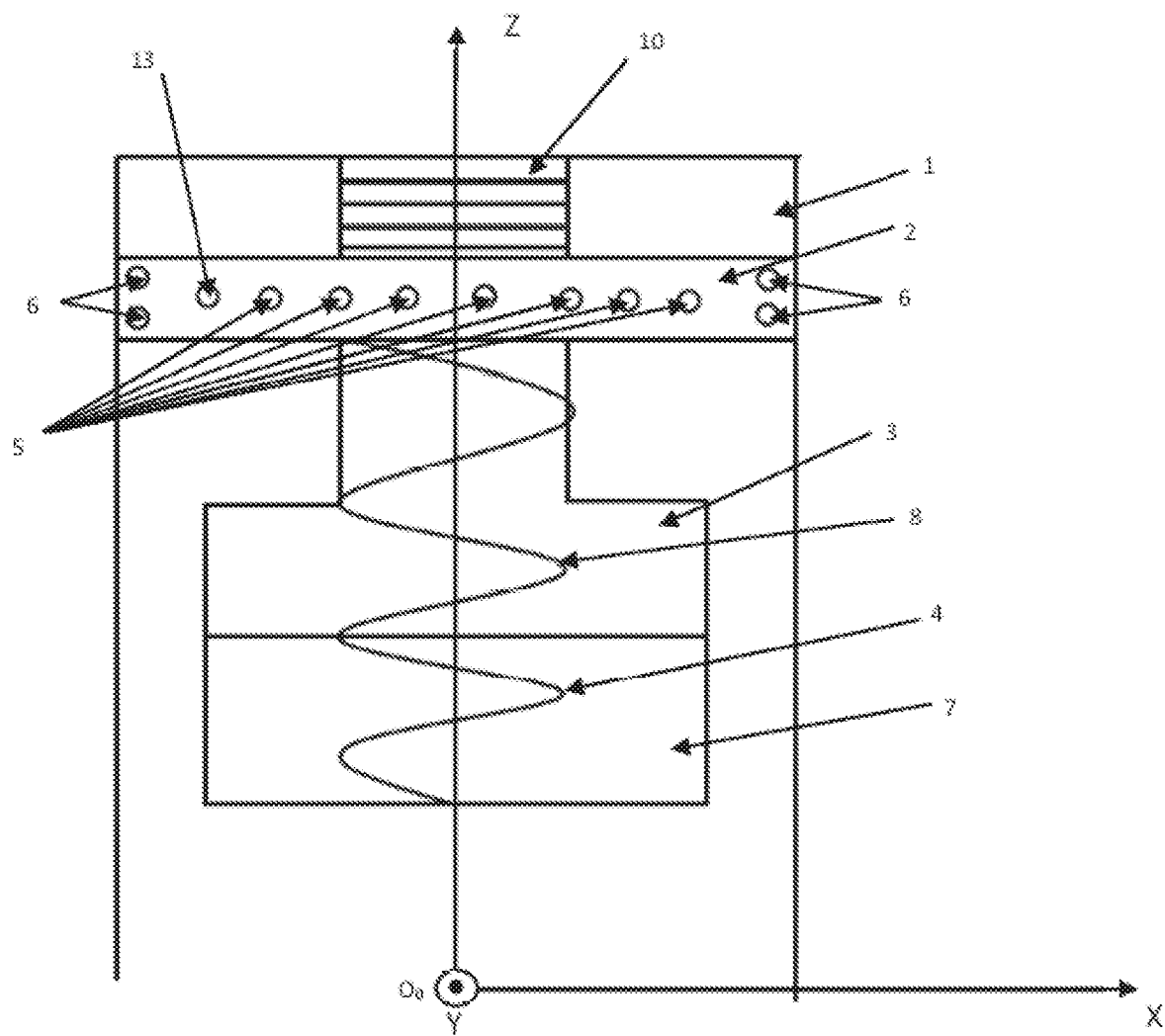
FIG. 3 is an alternative system for the additive manufacturing of printed components according to embodiments disclosed herein.

FIG. 3 illustrates an embodiment of an apparatus for an AM process that may utilize the method illustrated in FIG. 2. Elements having the same reference numeral may be considered to be the same in all figures. An ultrasonic concentrator or horn (3) may be connected on a first side to a substrate (2) and connected on a second side to an ultrasonic transducer (7). One of ordinary skill in the art would be able to determine the type and size of the ultrasonic transducer (7) and the ultrasonic concentrator or horn (3) based upon the desired properties. The first side and the second side of the ultrasonic concentrator (3) may be opposite each other. In some embodiments, the ultrasonic concentrator (3) and the ultrasonic transducer (7) may be located beneath the substrate (2). The substrate (2) may contain a plurality of channels (5) for the flow of a coolant (13). The channels (5) may run the length of the substrate (2) and the plurality may be spaced such that they cover the width of the substrate (2). The channels (5) may be any configuration that provides controlled cooling of the substrate (2). In some embodiments, the coolant (5) may be a liquid, a gas, a cryogenic liquid, a noble gas, water or combinations thereof. The substrate (2) may also contain a plurality of induction coils (6) providing a heat source for the substrate (2). The induction coils (6) may run the length of the substrate (2) and the plurality may be spaced such that they cover the width of the substrate (2). The induction coils (6) may be any configuration that provides controlled heating of the substrate (2).

Figure 4:
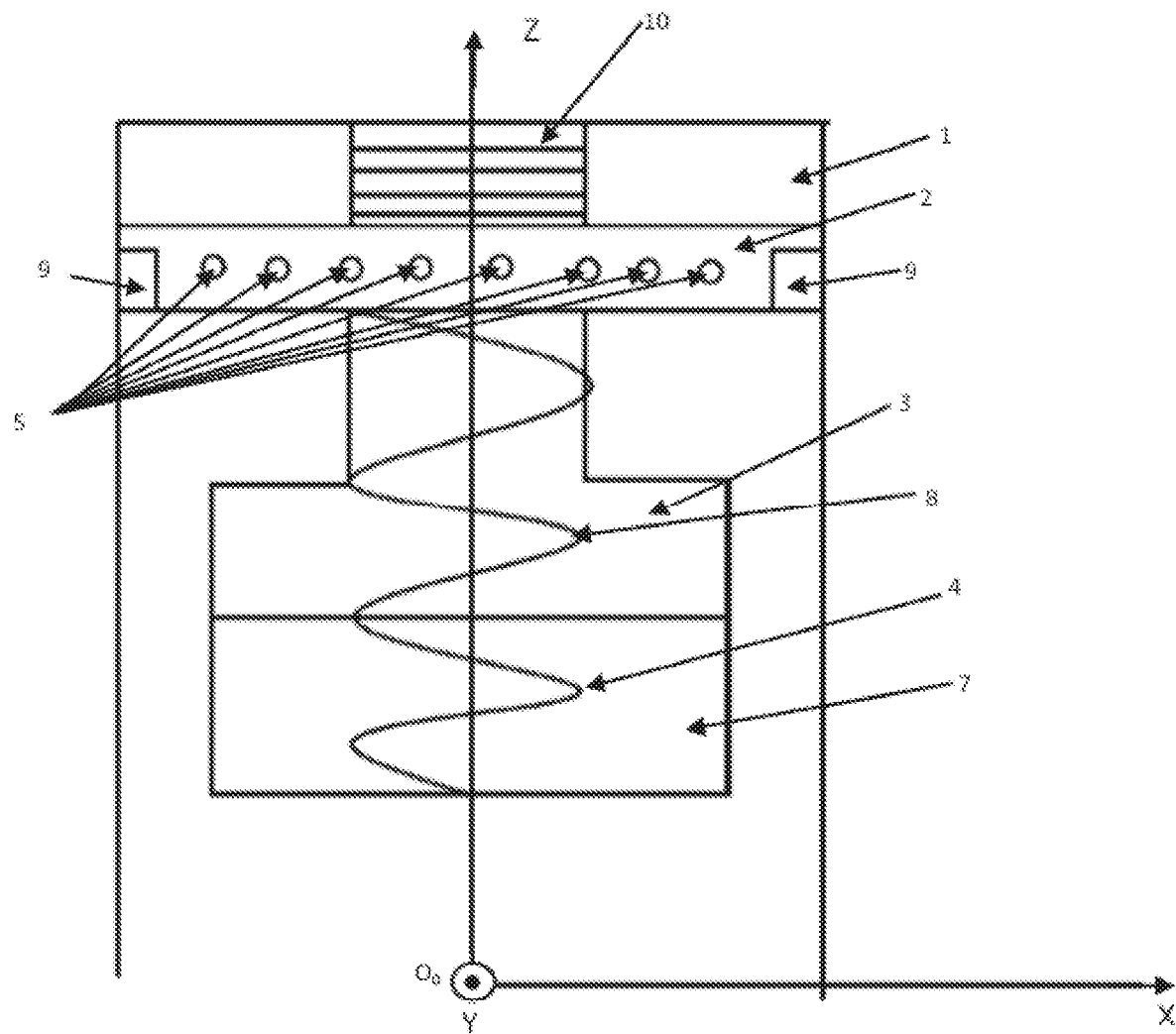
FIG. 4 is another alternative system for the additive manufacturing of printed components according to embodiments disclosed herein.

FIG. 4 illustrates another embodiment of an apparatus for an AM process that may utilize the method illustrated in FIG. 2. Elements having the same reference numeral may be considered to be the same in all figures. An ultrasonic concentrator or horn (3), such as that described above, may be connected on a first side to the substrate (2) and connected on a second side to an ultrasonic transducer (7), such as that described above. The first side and the second side of the ultrasonic concentrator (3) may be opposite each other. In some embodiments, the ultrasonic concentrator (3) and the ultrasonic transducer (7) may be located beneath the substrate (2). The substrate (2) may contain a plurality of channels (5) for the flow of a coolant, such as that described above. The substrate also contains one or more electro-resistive coil(s) or element(s) (9) as a heating source for the substrate. The electro-resistive coil(s) or element(s) (9) may run the length of the substrate (2) and may be spaced a horizontal distance from each other. In some embodiments, the electro-resistive coil(s) or element(s) (9) may be located on opposite sides of the substrate (2). Electro-resistive coil(s) or element(s) (9) may be any configuration that provides controlled heating of the substrate (2).

Figure 5:
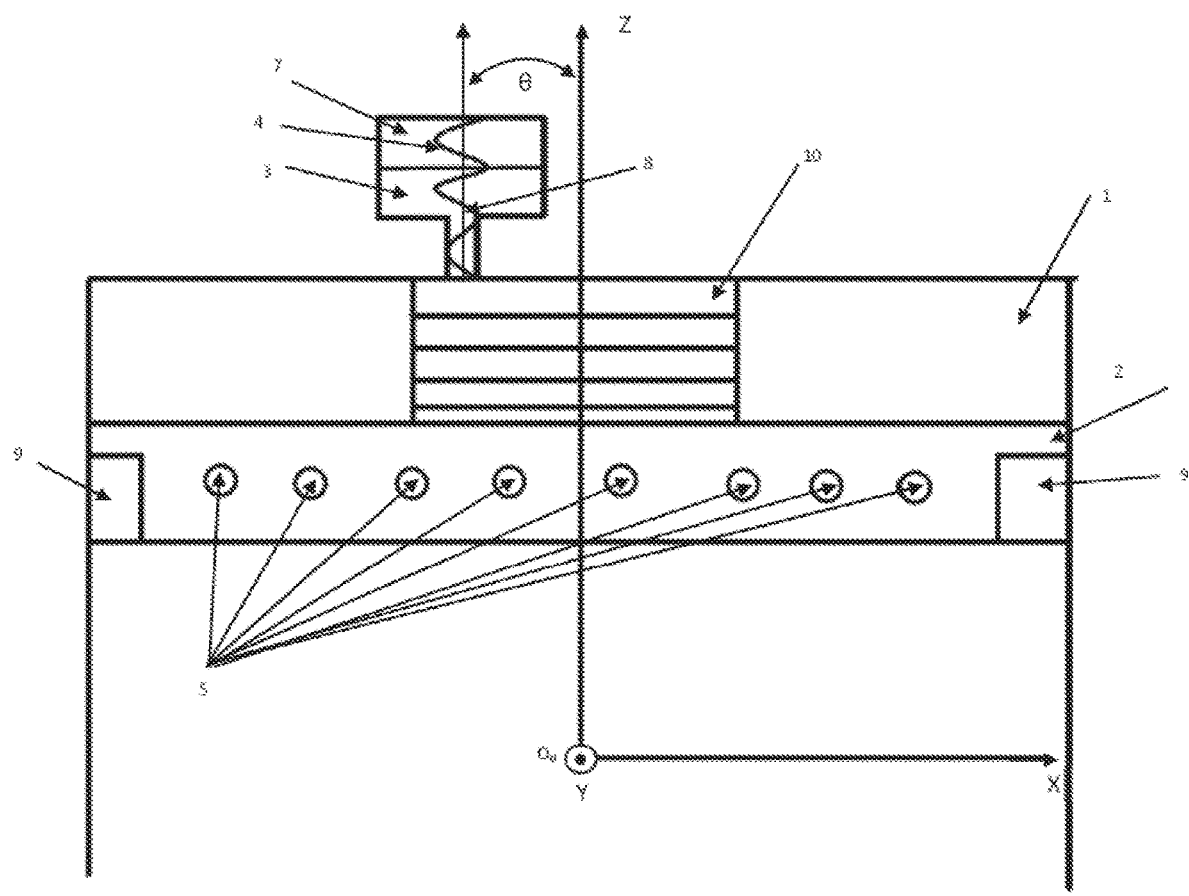
FIG. 5 is another alternative system for the additive manufacturing of printed components according to embodiments disclosed herein.

FIG. 5 illustrates another embodiment of an apparatus for an AM process that may utilize the method illustrated in FIG. 2. An ultrasonic concentrator or horn (3), such as that described above, is located above the powder at an angle (θ) against the 'Z' axis. The angle (θ) may range from about 0 degrees to about 85 degrees. The ultrasonic concentrator (3) may be connected to an ultrasonic transducer (7), such as that described above. The ultrasonic concentrator (3) is configured to come into contact with a solidified or fused powder, which may result in conducting the ultrasonic waves into the fused and/or molten powder. In some embodiments, the ultrasonic concentrator (3) is configured to be in contact with recently solidified material and the ultrasonic waves may be propagated to the melted pool. The ultrasonic transducer (7) generates an ultrasonic wave (4) as a result of an applied potential. The generated ultrasonic wave is then amplified by a certain value (8) as it propagates through the ultrasonic concentrator (3), such as described above. The substrate (2) may contain a plurality of channels (5) for the flow of a coolant, such as that described above. The substrate (2) may also contain a heating source (9). The heating source (9) may run the length of the substrate (2). The heating source (9) may be any configuration that provides controlled heating of the substrate (2).

In some embodiments, a controller may be configured to tune the ultrasonic transducer (7) to provide a wavelength specified by data stored in a computer-readable medium. The controller may also be configured to store data, such as that defined by a 3-dimensional computer-aided design (CAD) file, to describe the overall geometry of the component and control the energy beam to produce the three-dimensional printed component. The controller may also be configured to heat/cool a material on the substrate (2) by data stored in a computer-readable medium. In some embodiments, the controller may also be configured to issue commands to all parts of the systems described herein, such that the operation of the 3D printer is automatic.

While the disclosure includes a limited number of embodiments, those skilled in the art, having benefit of this disclosure, will appreciate that other embodiments may be devised which do not depart from the scope of the present disclosure. Accordingly, the scope should be limited only by the attached claims.

What is claimed:

1. An additive manufacturing process comprising:
   heating a first material layer on a substrate to produce a first molten volume;
   providing ultrasonic excitation to the first molten volume, wherein the ultrasonic excitation is provided in ultrasonic waves in a frequency range from 20 kHz to 20 MHz to achieve ultrasonic cavitation; and
   cooling the first molten volume in a controlled manner to produce a first fused solid layer,
   wherein the first fused solid layer is sandwiched between, and in direct contact with, the substrate and an ultrasonic horn, such that the ultrasonic horn amplifies the ultrasonic waves and guides the amplified ultrasonic waves directly to the first fused solid layer, and
   wherein cooling the first molten volume in a controlled manner comprises flowing a coolant through the substrate.

2. The method of claim 1, wherein the heating comprises directing an energy beam at the first material layer.

3. The method of claim 2, wherein the heating further comprises heating a substrate upon which the first material layer is disposed on.

4. The method of claim 3, wherein the heating the substrate comprises at least one of utilizing an electro-resistive element in the substrate or utilizing an induction heating coil in the substrate.

5. The method of claim 1, wherein the providing ultrasonic excitation comprises providing ultrasonic vibration directly to the first molten volume.

6. The method of claim 5, wherein the ultrasonic vibration is provided from at least one of an ultrasonic transducer coupled to the ultrasonic horn, a pulsed laser in combination with the ultrasonic horn or a combination thereof.

7. The method of claim 1, wherein the providing ultrasonic excitation comprises providing ultrasonic vibration directly to the first molten volume.

8. The method of claim 1, wherein the cooling the first molten volume comprises cooling a substrate upon which the first material layer is disposed on.

9. The method of claim 1, further comprising,
dispensing a second material layer on the first fused solid;
heating the second material layer to produce a second molten volume;
providing ultrasonic excitation to the second molten volume; and
cooling the second molten volume in a controlled manner to produce a second fused solid layer.

10. The method of claim 1, wherein cooling the first molten volume in a controlled manner comprises a cooling rate from about 6,000,000 degrees per second to about 10 degrees per minute.

\* \* \* \* \*